(12) United States Patent
Graham et al.

(10) Patent No.: US 7,095,355 B1
(45) Date of Patent: Aug. 22, 2006

(54) LOW POWER ADC FOR IMAGING ARRAYS

(75) Inventors: Roger W. Graham, Santa Barbara, CA (US); John T. Caulfield, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/125,509

(22) Filed: May 9, 2005

(51) Int. Cl.
*H03M 1/12* (2006.01)
*H03M 1/56* (2006.01)
*H01L 27/00* (2006.01)

(52) U.S. Cl. .................... 341/169; 341/172; 250/208.1

(58) Field of Classification Search ............... 341/172, 341/166, 156, 169; 250/208.1, 334, 214 R, 250/332; 327/132; 348/340, 308, 297; 375/242; 396/187
See application file for complete search history.

(56) References Cited

U.S. PATENT DOCUMENTS

| | | | |
|---|---|---|---|
| 2,632,058 A * | 3/1953 | Gray ........................... 375/242 |
| 3,303,359 A * | 2/1967 | Brisay, Jr. ................... 327/132 |
| 4,509,845 A * | 4/1985 | Mizokami ................... 396/187 |
| 5,128,534 A * | 7/1992 | Wyles et al. ............. 250/208.1 |
| 5,321,404 A * | 6/1994 | Mallinson et al. .......... 341/169 |
| 5,389,929 A | 2/1995 | Nayebi et al. .............. 341/156 |
| 5,619,262 A * | 4/1997 | Uno ............................ 348/297 |
| 5,886,660 A * | 3/1999 | Loewenstein ............... 341/166 |
| 6,040,568 A | 3/2000 | Caulfield et al. ......... 250/208.1 |
| 6,121,613 A | 9/2000 | Tew ............................ 250/334 |
| 6,137,432 A * | 10/2000 | Xiao ........................... 341/169 |
| 6,144,330 A * | 11/2000 | Hoffman et al. ............ 341/166 |
| 6,147,340 A * | 11/2000 | Levy ....................... 250/214 R |
| 6,150,649 A * | 11/2000 | Wake et al. .............. 250/208.1 |
| 6,204,496 B1 * | 3/2001 | Levy et al. ............. 250/214 R |
| 6,473,122 B1 * | 10/2002 | Kanekal ...................... 348/340 |
| 6,498,346 B1 * | 12/2002 | Martin ........................ 250/332 |
| 6,545,624 B1 * | 4/2003 | Lee et al. .................... 341/155 |
| 6,670,904 B1 * | 12/2003 | Yakovlev .................... 341/167 |
| 6,693,670 B1 * | 2/2004 | Stark .......................... 348/308 |
| 6,727,486 B1 * | 4/2004 | Choi ........................ 250/208.1 |
| 6,818,933 B1 * | 11/2004 | Henderson et al. ......... 257/290 |
| 6,885,331 B1 * | 4/2005 | Krymski ..................... 341/169 |
| 6,956,413 B1 * | 10/2005 | Bailey ........................ 327/131 |
| 7,012,557 B1 * | 3/2006 | Takayanagi et al. ........ 341/155 |

\* cited by examiner

*Primary Examiner*—Patrick Wamsley
(74) *Attorney, Agent, or Firm*—William C. Schubert; Karl A. Vick

(57) ABSTRACT

An analog to digital converter ADC is adapted for low power for use in an imaging array. The ADC is a digital inverter with feedback to convert an asynchronous ramp voltage to an output count at each crossing of a voltage threshold. A separate circuit generates a voltage ramp that is coupled through a capacitor to a photocurrent from a detector, generating an integrating voltage that is raised at a source follower circuit. The integrating voltage from the source follower circuit is converted to another voltage ramp and inverted at the ADC. A global count from an array of such ADCs is stored in a grey counter. The ADC is sufficiently power-efficient that each unit cell of an array of photo detectors can have its own ADC. Circuit and device-level embodiments are disclosed.

16 Claims, 7 Drawing Sheets

LOW POWER ADC FOR IMAGING ARRAYS

STATEMENT OF GOVERNMENT RIGHTS

This invention was made with government support under contract no. N66001-02-C-8078 awarded by the Department of the Navy. The government has certain rights in this invention.

FIELD OF THE INVENTION

The present invention relates to analog-to-digital circuits ADCs, and is a low power ADC particularly adapted for use in arrays of detector elements such as focal plane arrays FPAs.

BACKGROUND

A focal plane detector array comprises numerous detector unit cells or pixels, each of which converts incident electromagnetic radiation to an electric signal. The unit cells output an analog signal corresponding to scene radiation sensed by the particular detector element. These analog signals must be converted to digital in order to be combined and efficiently processed to resolve an image of a scene being viewed by the array of detector elements. It is noted that focal plane detector arrays are disposed within a temperature controlled chamber to minimize localized heat that might otherwise interfere with the intended scene radiation as noise. Excessive power dissipation, such as by power inefficient amplifiers and ADCs mounted in or near the chamber, places an additional burden on the Dewar or thermoelectric cooling elements that are employed for regulating chamber temperature.

Two types of ADCs have been found advantageous for use in imaging arrays: delta-sigma ADCs and residue readout ADCs. Delta sigma ADCs integrate the difference between an input signal and an output value. The integrator, typically an op-amp and a capacitor, is embedded in a feedback loop in such a way that the difference is driven to zero, making the output (a digital bit stream or word) equal in value to the voltage or current input. One example of a delta-sigma ADC is provided in FIG. 1 (prior art). The ADC of FIG. 1 is a first order delta-sigma ADC and includes a count and dump decimator, and is not configured to take advantage of the unipolar input. Note that the switch allows the reference value to be sent either to the sum or to the difference port of the summing function, enabling the circuit of FIG. 1 to follow both positive and negative signal inputs. Some of the advantages of this design include having a 20-bit capable ADC, without a requirement for a secondary ADC. However, this design typically requires a large counter that must be present in each ADC. Further, for a given frame time, the maximum signal to noise ratio (SNR) is constrained by the unit cell area, clock frequency, and power limitations. One difficulty with prior art delta-sigma circuits is that they generally employ an amplifier that consumes too much power for use in a large imaging array.

A modification of a first order delta-sigma ADC is the residue-readout ADC, sometimes referred to as an Eden ADC, shown generally in FIG. 2 (prior art). At the right of FIG. 2 is a necessary auxiliary ADC. The main advantage of the Eden ADC over a delta-sigma ADC is the presence of a residue readout [the node labeled $V_0$ (residue)], which enables the use of a smaller counter for a given signal to noise ratio (SNR) requirement. The resolution of the Eden ADC can be set higher than permitted by the length of the counter because the residue information can be used to refine the digital output word. The residue readout feature permits the Eden ADC to be operated as a delta-sigma ADC or a folding ADC. The Eden ADC can also take advantage of a unipolar signal provided by pixels or unit cells by replacing the adding and subtracting of the reference seen in FIG. 1 with a single charge dump capacitor that decrements the integration capacitor by a known amount. The bottom plate of the dump capacitor $C_{dump}$ may be connected to a reference voltage $V_{ref2}$, but ground can be used when layout constraints exist. As in all switched capacitor circuits, the switches provide a path for clock feed through, which appears as input offset current in the output digital word. Non-overlapping clock phases must be used. Eden ADCs are disadvantaged for use in an imaging array in that they require relatively high power per unit cell, the need for sample and hold buffers for each unit cell to provide the signal to the auxiliary ADC, and a SNR that is constrained to a maximum by residue read-out and the unit cell area for most embodiments.

Typically, delta-sigma and Eden ADCs are generally disposed one per column (or row) of arrayed unit cells, rather than per unit cell, to alleviate some of the above disadvantages. Many implementations attempted have involved placement of an ADC on the column of the read-out integrated circuit (ROIC). At least one attempt has involved an effort to fit a high dynamic range ADC to every unit cell in an infra-red FPA. However, these implementations each use ADC architecture of the delta-sigma or Eden variety, requiring significant power to achieve the bandwidth for use in an imaging array. What is needed is a low power ADC, such as one that may be used for each unit cell in a large imaging array, without drawing excessive power and without adding thermal noise that would reduce sensitivity of the detector elements that operate within the temperature controlled chamber.

SUMMARY OF THE INVENTION

This invention is in one aspect a circuit for converting an analog input current to a digital output count. The overall circuit has a voltage ramp circuit that generates a voltage ramp, a capacitor having a first plate coupled to an output of the voltage ramp circuit and an opposed second plate, and a digital inverter having an input coupled to the opposed second plate of the capacitor. The digital inverter changes state at a predetermined input voltage. Various optional embodiments include an output of the digital inverter being coupled to a counter with the output of the digital inverter being fed back to the input of the digital inverter, the opposed second plate of the capacitor being further coupled to a photocurrent that is output from a detector, a source follower circuit being disposed between the opposed second plate of the capacitor and the digital inverter, and a buffer circuit being coupled to an output of the digital inverter.

The present invention is in another aspect an array of unit cells. Each unit cell has a capacitor, a ramp circuit, a detector, and a digital inverter. The capacitor of each unit cell has a first and an opposed second plate. The ramp circuit of each is for generating an output voltage ramp that is output to the capacitor first plate. The detectors each provide a photocurrent output that is coupled to the capacitor second plate. The digital inverter of each unit cell has an input coupled to the capacitor second plate and an output coupled to a storage element. The overall array of unit cells further includes a counter coupled in parallel to an output of each unit cell. The counter is for accumulating digital outputs from each digital inverter in a global count. As above, preferably an output of each digital inverter is fed back to its input, and a source follower circuit is disposed between the second plate of the capacitor and the digital inverter.

The present invention is in another aspect a method of reading out an analog input signal as a digital count. In the method, a ramp voltage is applied to a first plate of a capacitor and an analog input signal is applied to an opposed second plate of the capacitor to result in an integrated voltage. That integrated voltage is input, though not necessarily without intervening manipulation, to a digital inverter to generate a digital count each time the integrated voltage crosses a threshold in at least one slope direction. A slope direction may be, for example, an increasing direction of voltage slope or a decreasing direction of voltage slope. Exemplary intervening manipulation may be modifying the integrated voltage from the capacitor to a higher integrated voltage having increased high and low voltage limits, and converting the integrating voltage to a ramping voltage. A plurality of the digital counts is accumulated over time.

These and other features, aspects, and advantages of embodiments of the present invention will become apparent with reference to the following description in conjunction with the accompanying drawings. It is to be understood, however, that the drawings are designed solely for the purposes of illustration and not as a definition of the limits of the invention.

DETAILED DESCRIPTION

Figure 1:
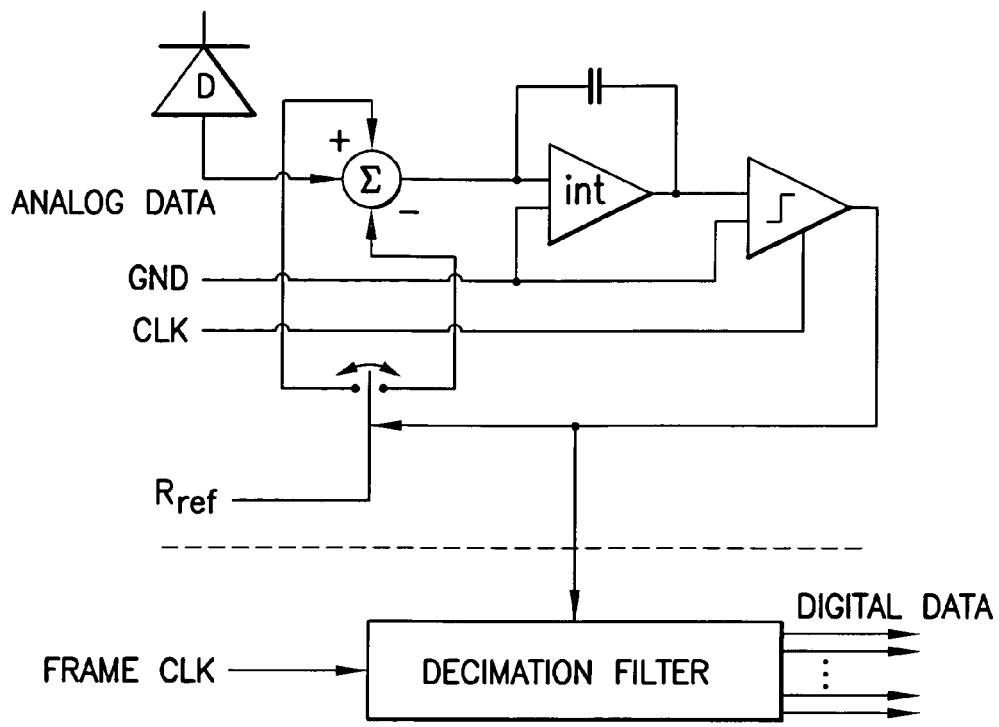
FIG. 1 is a circuit-level block diagram of a prior art delta-sigma ADC.
Figure 2:
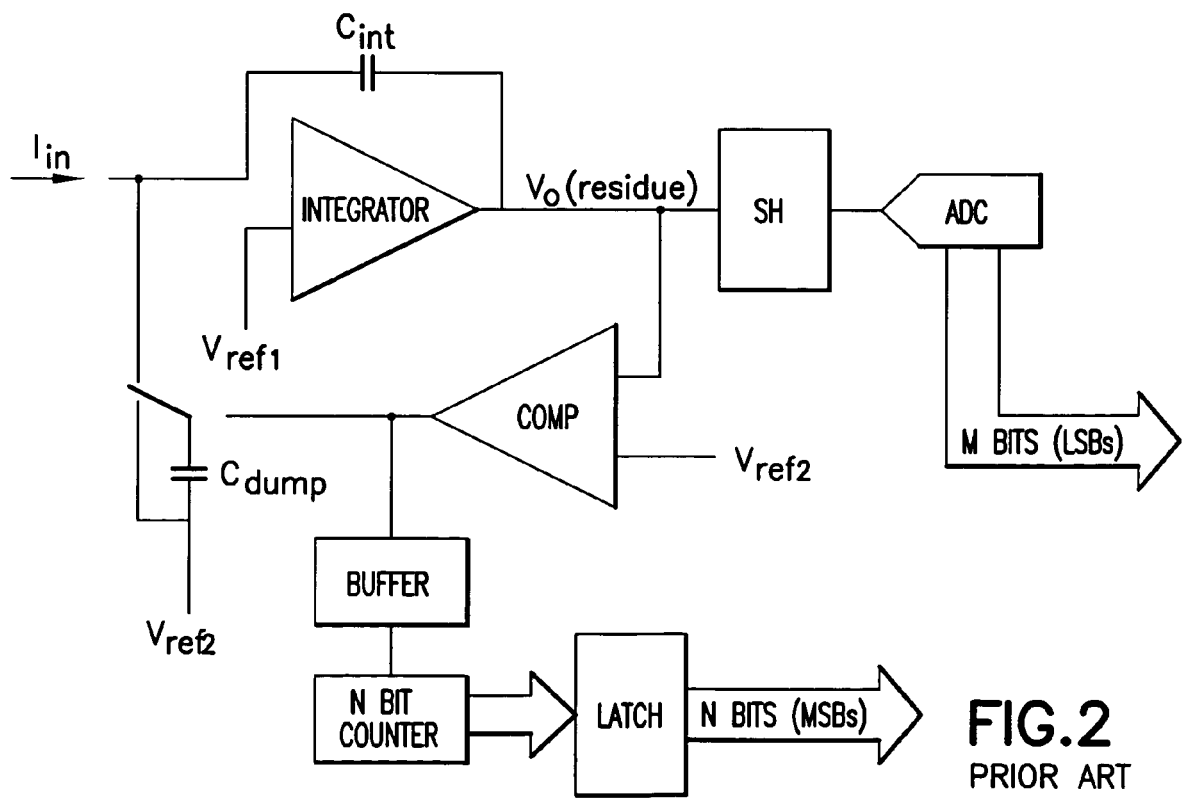
FIG. 2 is a circuit-level block diagram of a prior art residue—readout or Eden ADC.
Figure 3:
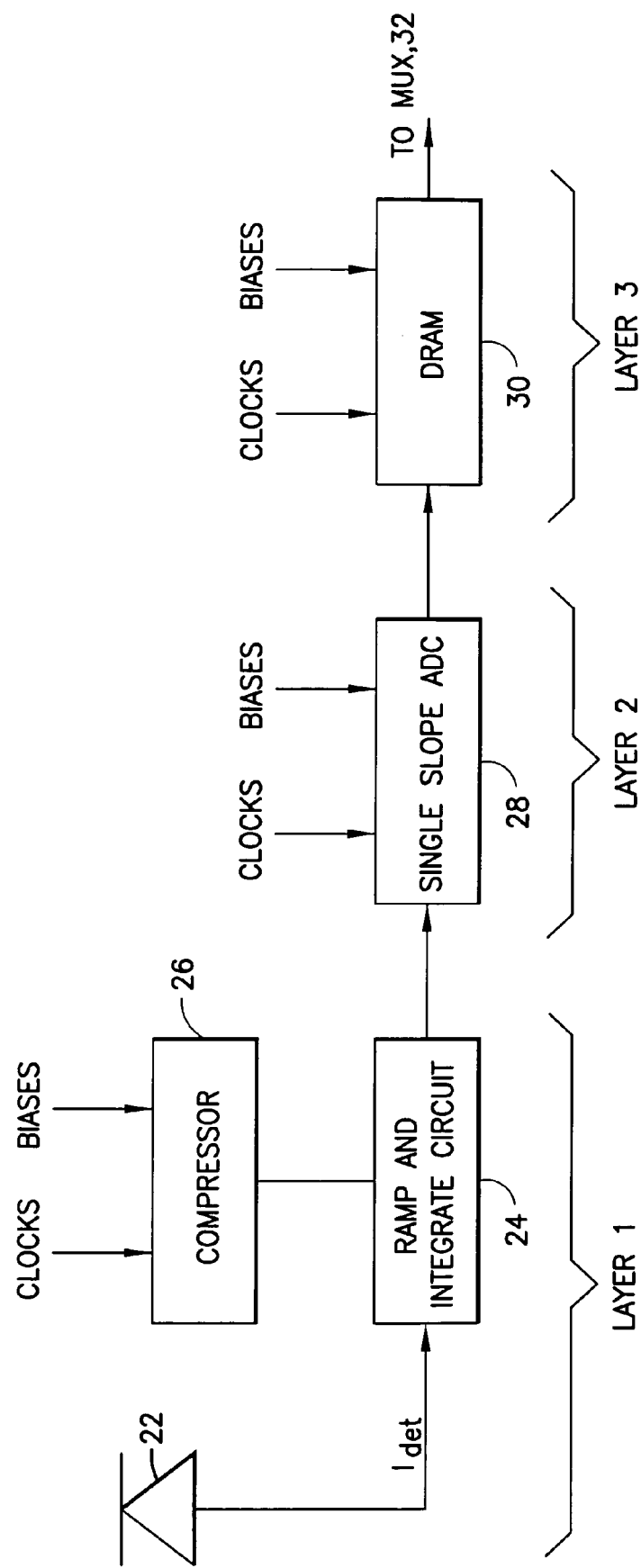
FIG. 3 is a high-level block diagram of a unit cell of a readout integrated circuit having an ADC according to the present invention disposed with each unit cell.

An overview of a particularly advantageous context for the inventive low power ADC is shown in block view at FIG. 3, a unit cell 20 of a readout integrated circuit ROIC that is preferably one of many disposed to match a detector pixel 22 of a focal plane array FPA. A common detector element 22 is a photo detector that senses and converts infrared IR radiation and into an analog electrical signal that is manipulated by the ROIC unit cell 20. Apart from the detector element 22 which is typically formed on a separate substrate (but shown with the ROIC unit cell 20 for context), each of the layers 1–3 represent different functional circuits, and also happen to correspond to different substrates on which CMOS circuitry is typically formed. The substrates for layers 1 and 2 are then paired, layer 2 is thinned, layer 3 is added and thinned to result in an array of ROIC unit cells 20 on a single substrate, which may or may not include further circuitry such as a digital processor to multiplex and analyze the data. The ROIC is coupled to the substrate bearing detector pixels 22 via indium bumps as well known in the art.

The detector element 22 is typically formed on a HgCdTe substrate with protruding indium bumps for mating with a ROIC, as known in the art. Common steps in forming detector elements 22 include masking, etching, disposing additional layers, and epitaxially growing layers. The detector elements 22 are generally sensitive to radiation within a wavelength band, such as short wavelength IR (about 1000–3000 nm), medium wavelength IR (about 3000–8000 nm), long wavelength IR (about 7000–14,000 nm), and very long wavelength IR (about 12,000–30,000 nm). Any particular array of detector elements may have all elements 22 sensitive to a common wavelength range, or may include elements 22 sensitive to one radiation band and other elements sensitive to a different band. Sensitivity to a radiation band refers to a maximum photosensitivity to the wavelength that lies within the band. Where the bands overlap as some bands above do, a particular detector element is sensitive to both bands if its maximum photosensitivity occurs at a wavelength within the overlap. While IR wavelengths have been used as exemplary, detector elements may be sensitive to wavelengths above or below the IR region.

The ROIC is typically formed on a silicon-based substrate and CMOS circuitry is formed via etching, growing, and disposing various layers of material on the substrate. Standard fabrication includes hybridizing the array of detector elements to the substrate defining the ROIC, some or all of the circuits of the ROIC may be made monolithically with the detector elements 22 rather than electrically coupled after being formed separately.

At layer 1, the detector pixel 22 outputs a current $I_{det}$ that is input into a voltage ramp and integrate circuit 24 that converts the input current $I_{det}$ to an integrating voltage. A compressor/limiter circuit 26 is also within ROIC layer 1 that uses a single metal oxide semiconductor field effect transistor (MOSFET). The compressor circuit 26 serves to prevent the detector element 22 from de-biasing under certain conditions. A device-level implementation of the ramp and integrate circuit 24 is presented at FIGS. 6A–6B, and further details may be found in co-owned and co-pending U.S. patent application Ser. No. 11/125,510, filed on May 9, 2005 and entitled "Unit Cell compression Circuit and Method".

Novel aspects of the present invention may be found in layer 2 of FIG. 3, a analog to digital converter ADC 28 for converting the integrating voltage output from the detector-driven ramp circuit 24 to a digital output. For context, that digital output is preferably stored, along with chronologically corresponding outputs from numerous other similar unit cells 20, in a DRAM stack 30. These stored digital values are then multiplexed 32 to resolve a temporal image from the array of unit cells 20.

Figure 4:
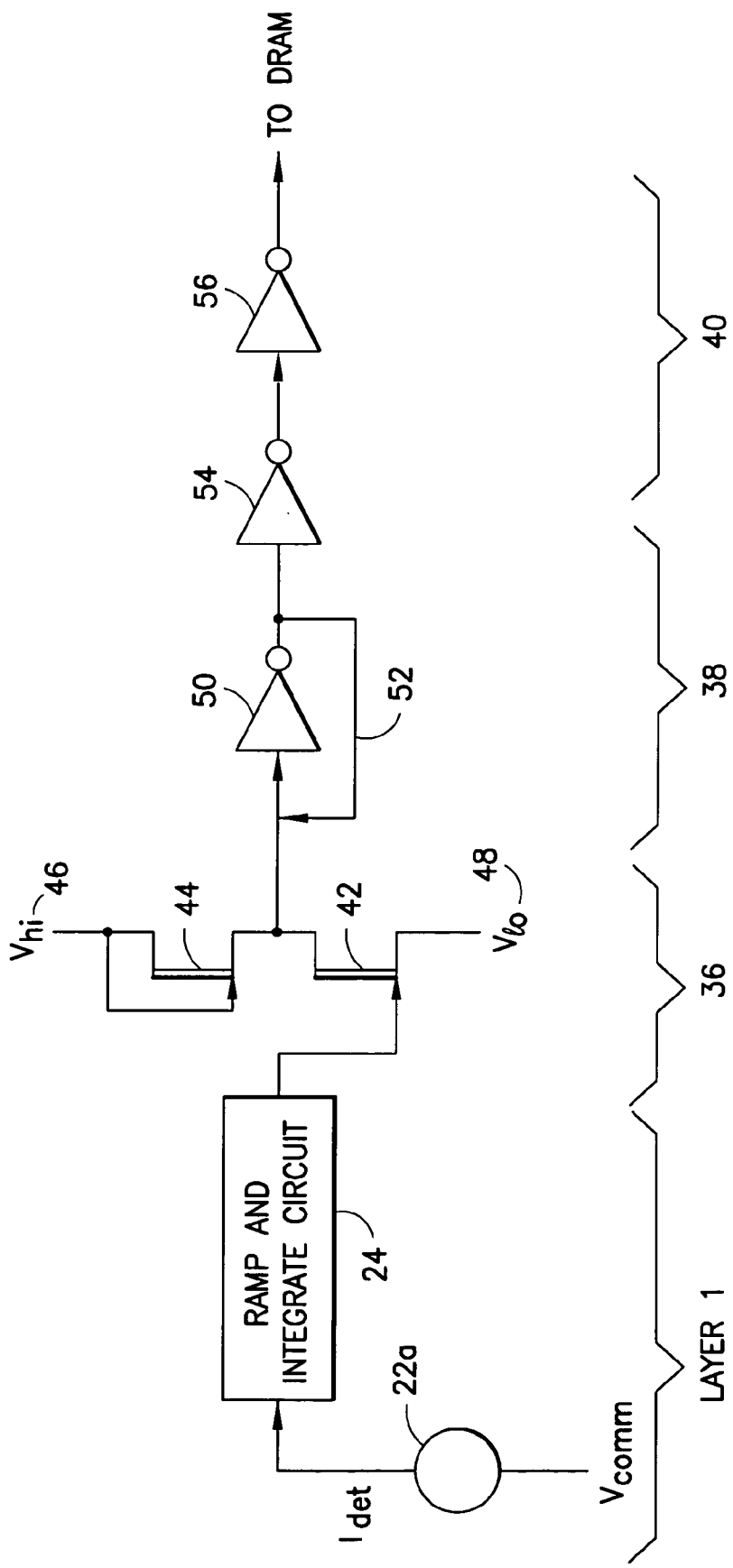
FIG. 4 is a circuit-level diagram of the low-power ADC of FIG. 3.

A circuit level diagram of the inventive ADC circuit 28 in the context of a detector unit cell 20 is shown in FIG. 4. The current source 22a driving the ramp and integrate circuit 24 is a photocurrent from the detector 22. Due to operation of the ramp and integrate circuit 24, the input to the ADC circuit 28 is an integrated voltage, preferably integrated between 1.3 V and 3.3 V. The novel ADC circuit 28 is in three functional portions: a source follower circuit 36, a comparator 38, and a buffer 40. The source follower circuit 36 includes a first source follower (SF) FET 44 in series with a second SF FET 44 between a SF high voltage node 46 and a SF low voltage node 48. The integrating voltage input from the ramp and integrate circuit 24 is injected between the gate and drain of the first SF FET 42, and the output is taken between the source and the drain. The SF FETs 42, 44 are a matched pair so that the second FET sinks a current appropriate to the condition that $V_{GS}$, the gate-source voltage, is zero. The result is that, neglecting leakage current, $V_{GS}=0$ for each of the matched SF FETs 42, 44, and the second SF FET 44 is a follower with zero voltage offset. While simpler source followers are known, the paired SF FETs 42, 44 offer the advantages of zero offset voltage and improved linearity over single FET implementations.

The remainder of the novel ADC circuit 28 is the comparator circuit 38 and the buffer circuit 40. The comparator in the preferred embodiment operates as a digital inverter 50 with feedback 52. The buffer circuit 40 preferably includes a first 54 and second 56 buffer stage in series with one another, where the buffer stages are each digital inverters. As digital inverters are passive devices, they are particularly advantageous in an ADC circuit 28 intended to operate under low power conditions. The dual inverter stages 54, 56 of the buffer circuit 40 serve to smooth outputs by amplifying or attenuating borderline signals to one or another digital value, while imposing little time delay in the overall ADC circuit 28.

Figure 5:
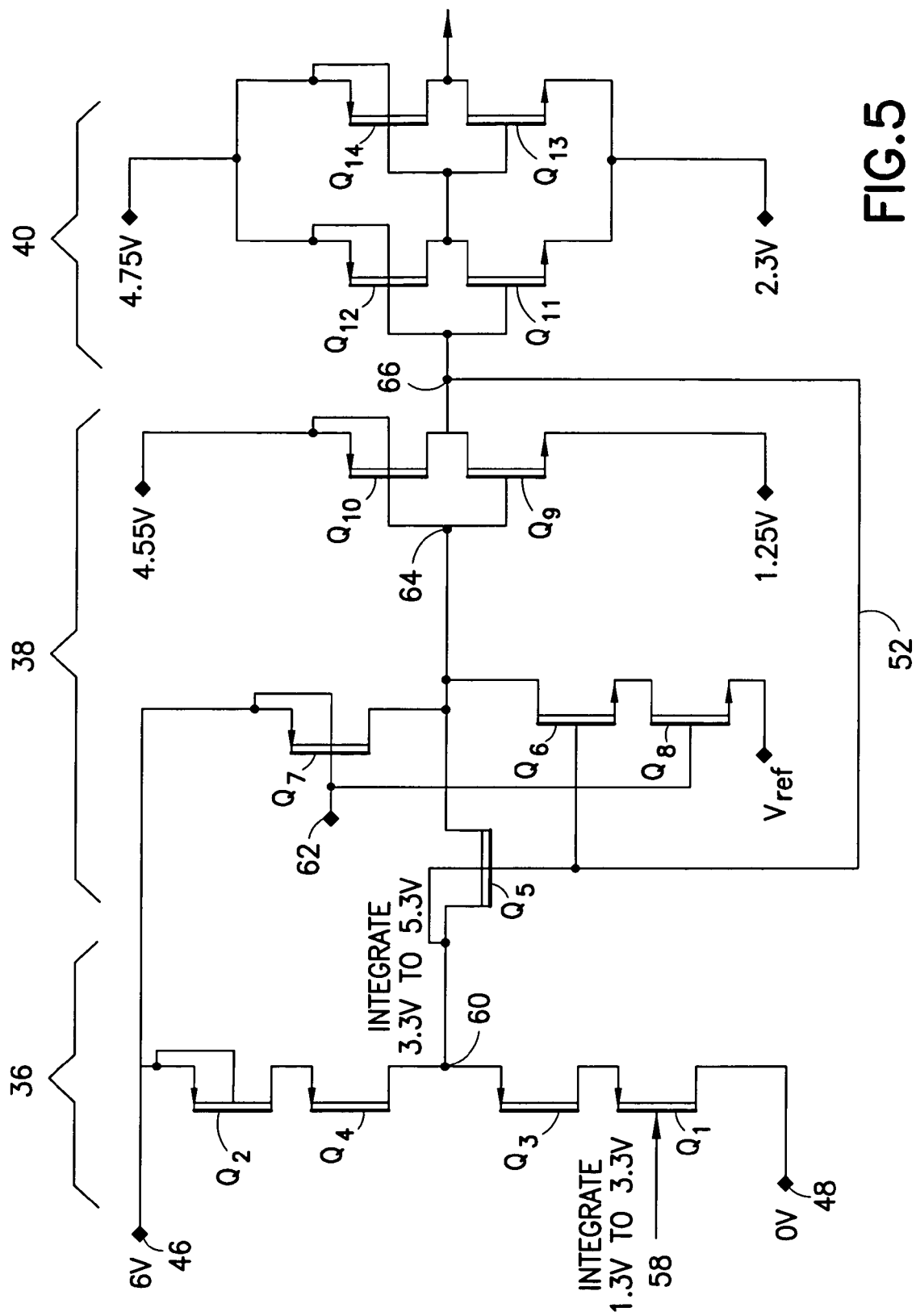
FIG. 5 is a device-level diagram showing CMOS implementation of the source-follower, comparator, and buffer circuits of FIG. 4.

FIG. 5 is a device-level diagram of the SF circuit 36, comparator circuit 38 and buffer circuit 40 of FIG. 4. The SF circuit 36 operates to buffer the unit cell capacitor voltage and to drive the input into the comparator circuit 38. Preferably, the SF circuit 36 includes two matched pairs of transistors $Q_1$–$Q_2$ and $Q_3$–$Q_4$. An input voltage 58 that integrates between a low (e.g., 1.3 V) and high (e.g., 3.3 V) integrated voltage levels is injected between the gate and drain of one the outboard SF FET $Q_1$ nearest the SF low voltage node 48. The SF circuit 36 raises the input integrated voltage 58, preferably 2.0 V to a SF output integrate voltage 60 between 3.3 V and 5.3 V as indicated in FIG. 5 that serves as the input voltage to the comparator circuit 38.

As noted above, the comparator circuit 38 in the preferred embodiment includes a digital inverter with feedback 52. In the preferred CMOS implementation of FIG. 5, the comparator includes a modified NAN gate and an inverter. The modified NAN gate includes transistors $Q_5$ and $Q_6$ having gates operated by the feedback line 52 (e.g., the feedback node 66) and transistors $Q_7$, $Q_8$ having gates operated by a comparator release control node 62. The input to the inverter at node 64 goes low only if both the feedback node 66 and the release control node 62 go high. If both said nodes are high, the series NMOS switches $Q_8$ and $Q_6$ are both ON, pulling the output stiffly to ground (or $V_{ref}$ in FIG. 5). Series PMOS switches $Q_5$ and $Q_7$ cooperate by being OFF, and no current flows. In a NAND gate of the prior art, transistors $Q_5$ and $Q_7$ would each be coupled to the SF high voltage node 46 in parallel, and either of the switches $Q_5$ and $Q_7$ being ON would cause current to flow. In the CMOS diagram of FIG. 5, current will flow only when $Q_7$ is ON, because $Q_5$ is in series with $Q_7$ and may conduct only under that condition, when the comparator release node 62 goes low. Because the feedback node 66 controls the gates to transistors $Q_5$ and $Q_6$, the result is a ramping down of voltage at the inverter input node 64 from the input integrating voltage at the comparator input node/SF output node 60.

The inverter of the comparator circuit 38 includes two MOSFETs $Q_9$ and $Q_{10}$ disposed in parallel and alternately enabled, and is known in the art. A grounded input cuts off the bottom transistor $Q_9$ and turns on the top transistor $Q_{10}$, pulling the output at the feedback node 66 to HIGH (4.55 V as depicted). A high input does the reverse, pulling the output at the feedback node 66 to LOW (1.25 V as depicted in FIG. 5). The output at the feedback node 66 has low impedance in both states.

The feedback 52 serves to speed the tripping action of the comparator 38 by disconnecting the driving circuitry as the comparator trips. As the comparator 38 trips (e.g., as node 66 goes to 4.55 Volts), PMOS $Q_5$ is turned off. This serves to snap node 64 down to $V_{ref}$ faster, and adds the additional advantage of reducing kick-back of the comparator 38 to the driver (node 60). In this latter function, it serves to reduce coupling from the comparators 38 to the driver.

The downward ramping action is created when node 58 is ramped down. Since $Q_1$ is a source follower, as the gate of $Q_1$ is ramped down, the source follows it. This in turn ramps node 60 down. $Q_1$ serves to level shift the input signal at node 58 by about 2 volts, so the voltage at node 60 is about 2 volts higher than that at node 58. The voltage at node 60 equals that at node 64 when $Q_4$ is on. Hence, node 64 follows node 58.

The buffer circuit 40 is preferably two inverters as described generally immediately above disposed in series with one another. A first buffer inverter has MOSFETs $Q_{11}$ and $Q_{12}$ in parallel with one another and alternately enabled, whose output serves as an input to a second buffer inverter having MOSFETs $Q_{13}$ and $Q_{14}$ similarly disposed. The two buffer inverters share common high and low voltage nodes (4.75 and 2.3 V, respectively in FIG. 5).

As the signal ramps down in voltage at node 64, the inverter $Q_9$/$Q_{10}$ of the comparator circuit 38 trips, which is output as a count that is stored in the unit cell DRAM stack. The comparator circuit 38 only draws power when it is near tripping, and in the aggregate uses only a fraction of the power used in delta-sigma converters of the prior art. There is no static power draw from the converter circuit 38, as there is no quiescent current in any of the SF circuit 36, the comparator circuit 38, or the buffer circuit 40. In general, the circuit operates as follows. The comparator is held in reset by opening the gate for transistor $Q_7$ using control node 62. The converter circuit 38 is enabled by closing the gate to transistor $Q_3$. The voltage at node 60 integrates from 3.3 V to 5.3 V, and is allowed to settle. The gate for the transistor $Q_7$ is then closed using control node 62, allowing the comparator circuit 38 to conduct. As the voltage ramps down at node 64, the inverter trips and a high output is sent from the buffer to be accumulated at an array-wide counter.

Figure 6A:
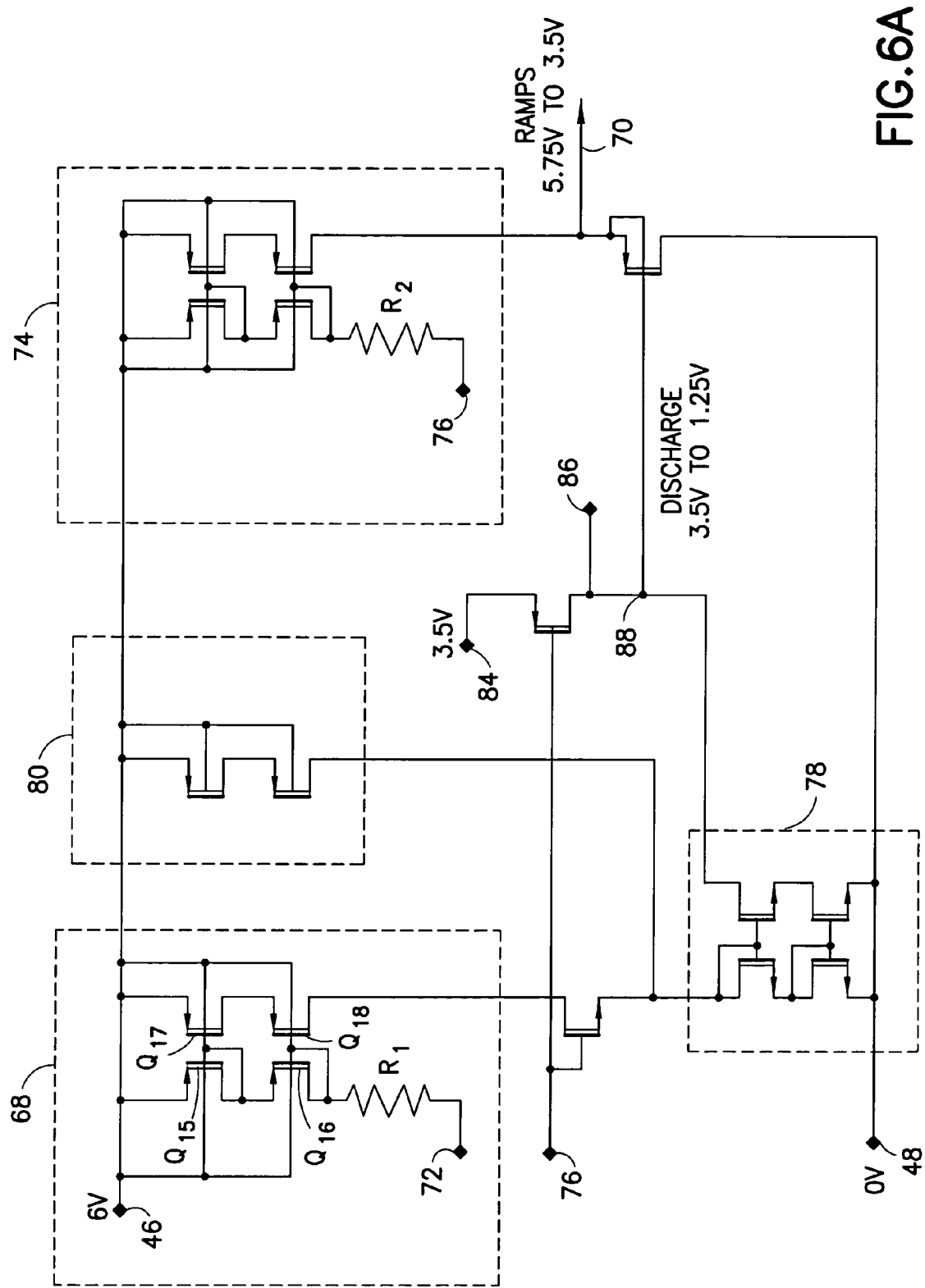
FIG. 6A is a device level diagram showing CMOS implementation of a ramp circuit portion of the Ramp and Integrate circuit of FIG. 3.

FIG. 6A is a device level diagram showing CMOS implementation of a ramp circuit portion of the Ramp and Integrate circuit of FIG. 3. Two pairs of FETs $Q_{15}$/$Q_{16}$ and $Q_{17}$/$Q_{18}$, each pair in series and the opposed pairs in parallel with one another between a first resistor $R_1$ and a high voltage node comprise a rate-setting sub-circuit 68 that determines, using rate node 72, how fast or slow the ramp circuit ramps an output voltage 70. Sub-circuit 68 operates to set the rate at which the output voltage 70 changes, by means of the resistor $R_a$ and the rate voltage node 72. An identical sub-circuit, differing only in device parameters but not interrelationship and termed the driver sub-circuit 74, operates to drive the ramp circuit by means of the resistor $R_2$ and the voltage driver node 76. High 46 and low 48 voltage nodes are coupled via a current mirror sub circuit 78 and a trickle current sub circuit 80. The ramp circuit is reset via a reset node 82 that enables a reset voltage node 84 (preferably 3.5 V). The reset voltage node 84 operates with the current mirror sub circuit 78 to pull up voltage from the low voltage node 48, resulting in a discharge a voltage (preferably between 3.5 V and 1.25 V) at node 88 that switches a transistor to allow the output voltage 70. An optional readout node 86 enables the discharge voltage to be monitored. The output voltage 70 thereby ramps between two voltages (preferably between 5.75 V and 3.5 V) between the high 46 and low 48 voltages input to the ramp circuit.

Block 78 is a current mirror sub-circuit whose function is to set a discharge current of the ramp capacitor. By adjusting the voltage applied at node 72 (or changing the resistor $R_1$), the discharge current can be adjusted. This adjusts the ramp rate. Adjustment is necessary so that the time it takes to ramp 2 volts equals the time it takes the digital counter to count to the desired resolution (e.g., 2048, 4096).

The trickle current sub-circuit 80 serves to keep the current mirror sub-circuit 78 on at all times. The small trickle current that it provides enables the current mirror sub-circuit to respond faster when the full current is enabled through block 78 from block 68.

It is noted that the ramp circuit of FIG. 6A is asynchronous. This is to reduce power consumption and complexity to better adapt the overall ADC circuit to a unit-cell deployment in an array of detectors. For example, accurately stepping and settling an LSB every 10 nsec would require additional power as compared to discarding the LSB, and is expected to necessitate a comparator that would have to be disabled while the DAC ramp changes to prevent overshoot (requiring enable/disable clocking that would draw more power due to the fast clocks required). The asynchronous implementation involves discarding the least significant bit (LSB) to prevent the comparator 38 from tripping mid-bit. Adverse results are minimized by employing a Gray counter. Since only one bit is changed per count in a Gray counter, at most the ADC will be off by one LSB.

Figure 6B:
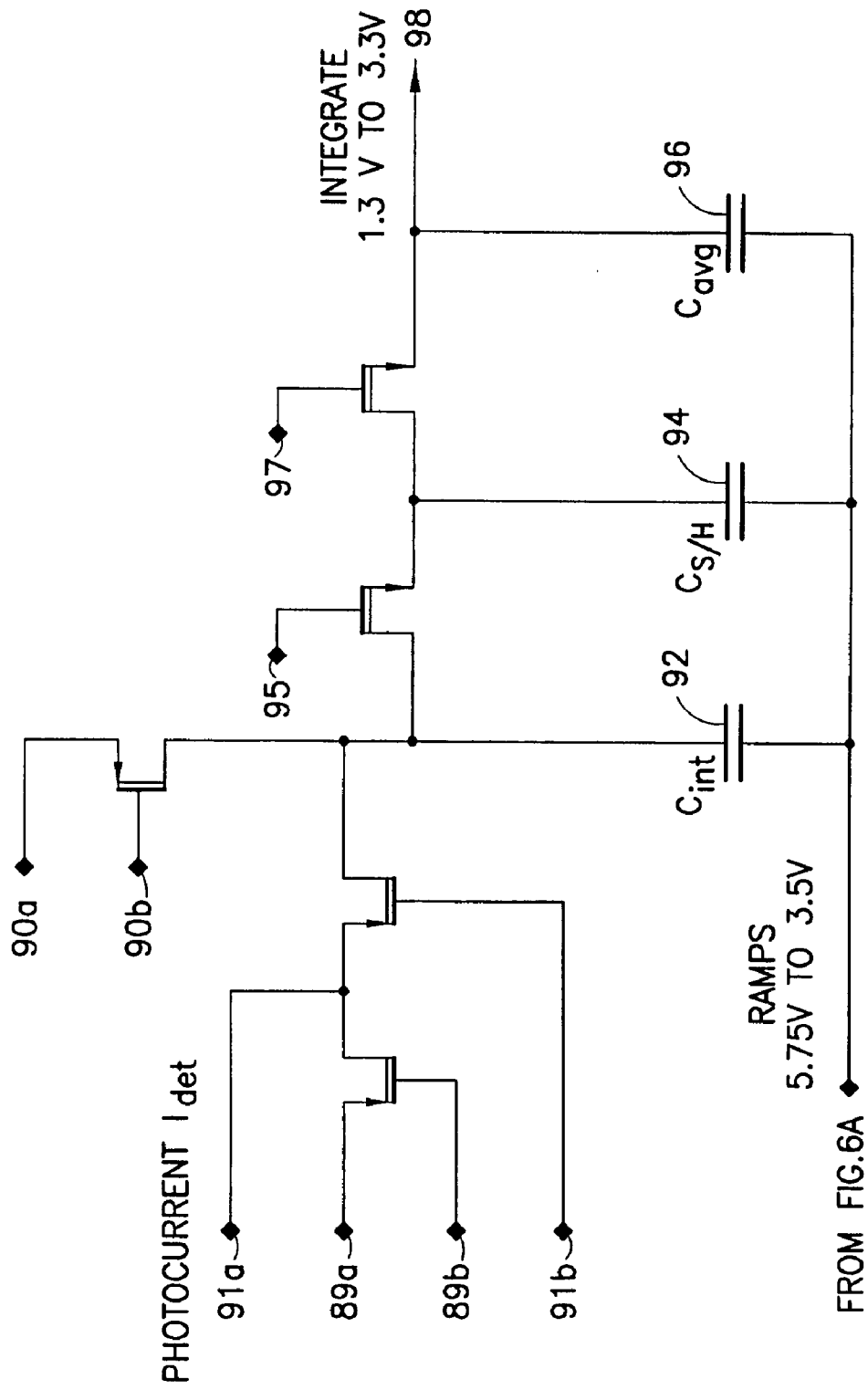
FIG. 6B is a device-level implementation of an integrate portion of the Ramp and Integrate circuit of FIG. 3.

FIG. 6B is a device-level implementation of an integrate portion of the Ramp and Integrate circuit of FIG. 3. Optional portions of FIG. 6B include a test voltage node 89a and a test enable control 89b; and a reset node 90a and control 90b. Photocurrent from the detector 22 is applied at node 91a and controlled at 91b. An input ramp voltage, such as the output voltage 70 from FIG. 6A, is applied in parallel to one plate of each of three capacitors: an integrating capacitor 92 ($C_{int}$), a sample and hold capacitor 94 ($C_{S/H}$), and an averaging capacitor 96 ($C_{avg}$). The opposed plate of each capacitor is coupled to the photocurrent from the detector 22 (via node 91a) to output an integrated voltage 98 that is applied to the source-follower circuit 36 of FIG. 4. Switches controlled by a sample/hold node 95 and an averaging node 97 are closed to couple the opposed plate of each capacitor 92, 94, 96 to the output line 98. When both switches are closed, the output voltage 98 integrates between 1.3 V and 3.3 V as shown (given $C_{int}$=800 fF, $C_{S/H}$=25 fF, and $C_{avg}$=200 fF, where 1 fF=$10^{-15}$ farads).

It is a novel aspect of this invention that the ramping voltage 70 that is output from the voltage ramping circuit (FIG. 6A) is applied to the lower plate of the unit cell capacitors $C_{int}$ 92 and $C_{S/H}$ 94 (FIG. 6B), and is not input directly into the the inverter 50 (FIG. 4) of the ADC 28 (FIG. 3). It is also a novel aspect that the ADC 28 is a single-slope ADC, where the ramp output voltage 70 is zeroed using the reset node following each measurement (each trip of the inverter 50). While single slope converters are generally known in the art, the particular circuit arrangement of using a digital inverter 50 with feedback 52 to convert a ramping voltage at node 64 (of FIG. 5, not the same as the ramp output voltage 70 of FIG. 6A, but related) avoids much of the time delays inherent in those single slope converters generally known in the art. This combination of low quiescent power and minimized time delays in the analog to digital conversion enable the ADC of the present invention to be applied to individual unit cells in an array of IR (or other wavelength) detectors 22.

Returning to FIG. 4, the output of the ADC 28 (e.g., the output of the second buffer 56) is a digital count. When the present invention is deployed in each unit cell of an array of detector unit cells, these counts are accumulated in an array-wide counter such as a ripple counter or preferably a Gray counter, the difference being that a Gray counter allows only one bit of N bits to change at a time (where the modulus of the counter is $2^N$), whereas the more than one bit in a ripple counter may change with the addition of one count because it counts sequentially (in base two). For example, a modulus 8 ripple counter may register a sequential count as [000, 001, 010, 011, 100, etc.], whereas a Gray counter would register a similar sequential count as [000, 001, 011, 010, 110, etc.]. To accumulate the counts of the various ADCs in parallel arranged unit cells, a Gray counter is preferred because it is faster, though a ripple counter is simpler to implement [e.g., a ripple counter may use a Mealy machine where a register output is delayed and fed into an adder input, whereas a Gray counter generally uses a finite state machine]. Either counter is operable to accumulate counts of ADCs in parallel however. Tripping of the separate ADCs is recorded in a DRAM (dynamic random access memory) or other memory element where it is digitally reconstructed, pixel by pixel, to display a visual image corresponding to the (preferably wavelength differentiated) photocurrents generated by the spatially separated detectors 22.

Figure 7:
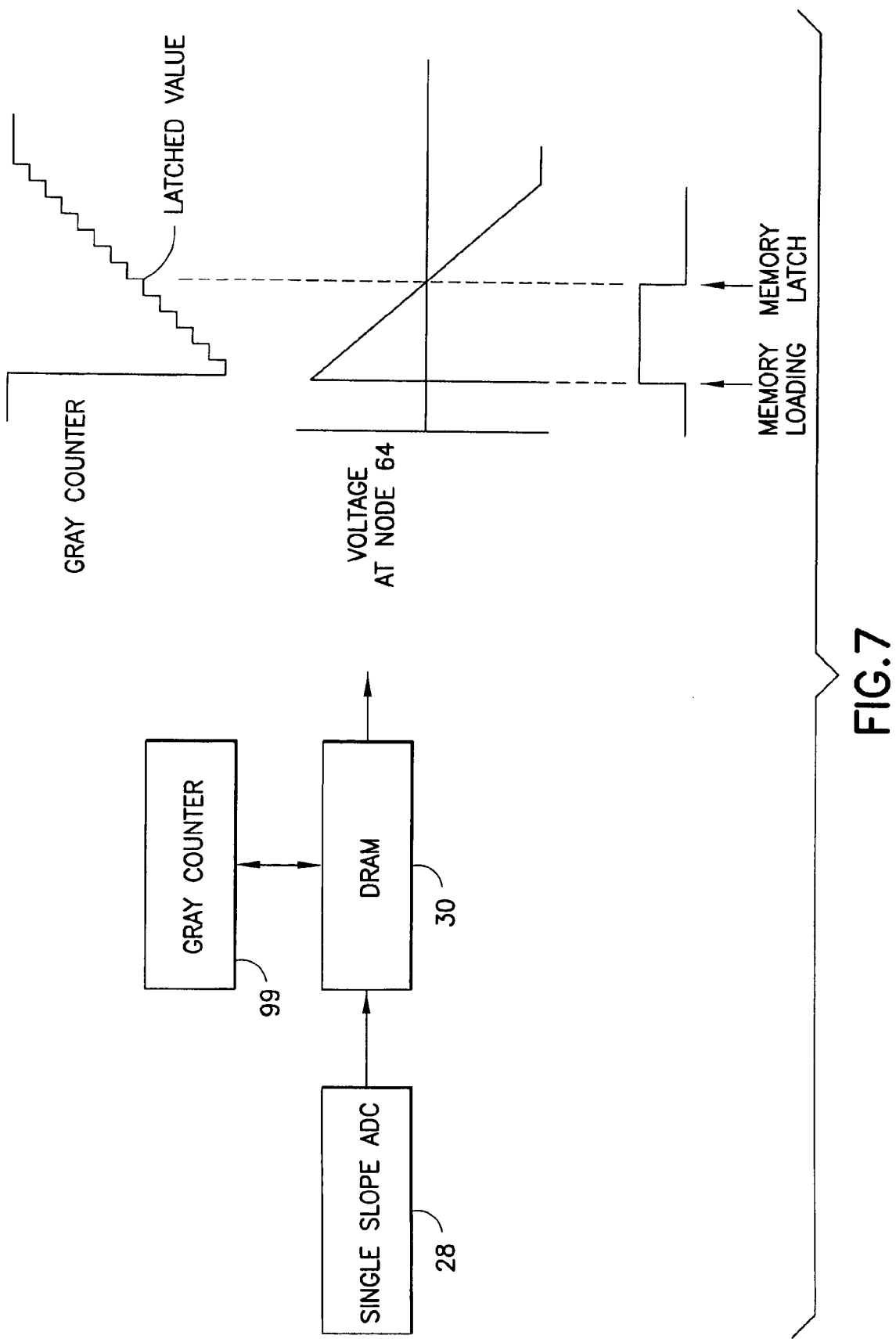
FIG. 7 is a timing diagram showing generation of one count at one ADC that increments a Gray counter, the Gray counter accumulating counts from an array of paralleled ADCs.

A timing diagram showing one ADC in relation to the Gray counter is shown in FIG. 7. The voltage at node 64 is decreasing, and the tripping voltage at which a count is output may be anywhere along the decreasing ramp but is chosen at the center for convenience. As the voltage at node 64 decreases through the threshold, the inverter 50 trips and the memory is latched with a count. That count increments the Gray counter in the uppermost graph by one. The Gray counter increments with each count from any ADC in the array, and the voltage and digital output of the companion graphs account for only one of the incremental steps in the Gray counter graph.

Deploying an ADC in each unit cell of an array of unit cells, where each unit cell includes one detector 22 (though one detector may sense more than one wavelength band) allows the electronics of such an array to be massively paralleled. Low power consumption alleviates much of the heat generation problems previously frustrating prior attempts to do so, and enables a high speed readout with less power required, no column read noise, and the capability for high speed, real time oversampling of pixels.

Although described in the context of particular embodiments, it will be apparent to those skilled in the art that a number of modifications and various changes to these teachings may occur. Thus, while the invention has been particularly shown and described with respect to one or more preferred embodiments thereof, it will be understood by those skilled in the art that certain modifications or changes may be made therein without departing from the scope and spirit of the invention as set forth above.

What is claimed is:

1. A circuit for converting an analog input current to a digital output count comprising:
a voltage ramp circuit that generates a voltage ramp;

a first integrating a capacitor having a first plate coupled to an output of the voltage ramp circuit and an opposed second plate coupled to an analog photocurrent that is output from a detector;

a second capacitor in electrical parallel with the first integrating capacitor; and a digital inverter having an input coupled to the opposed second plate of the first integrating capacitor and to the opposed second plate of the second capacitor and changing state at a predetermined input voltage.

2. The circuit of claim 1 further comprising a buffer circuit having an input coupled to an output of the digital inverter.

3. The circuit of claim 2 wherein the buffer circuit comprises first and second inverters in series with one another.

4. The circuit of claim 1 wherein an output of the digital inverter is coupled to a counter and the output of the digital inverter is fed back to the input of the digital inverter.

5. The circuit of claim 1 further comprising a source follower circuit disposed between the opposed second plate of the first integrating capacitor and the digital inverter.

6. The circuit of claim 1 wherein the first integrating capacitor and the second capacitor are coupled at opposed second plates through a switch.

7. The circuit of claim 1 wherein the voltage ramp circuit is asynchronous.

8. An array of unit cells, each unit cell comprising:

a first and a second capacitor in electrical parallel with one another and each defining a first and an opposed second plate;

a ramp circuit for generating an output voltage ramp that is coupled to each of the first plates;

a detector having an photocurrent output that is coupled to each of the second plates; and a digital inverter having an input coupled to each of the second plates and an output coupled to a storage element;

wherein the array further comprises a counter coupled in parallel to an output of each unit cell, said counter for accumulating digital outputs from each digital inverter in a global count.

9. The array of claim 8 wherein, for each unit cell, an output of the digital inverter is fed back to the input of the digital inverter.

10. The array of claim 8 wherein each unit cell further comprises a source follower circuit disposed between the opposed second plate of the first capacitor and the digital inverter.

11. The array of claim 8 wherein each unit cell further comprises a buffer circuit having an input coupled to an output of the digital inverter.

12. The array of claim 8 wherein, for each unit cell, the voltage ramp circuit is asynchronous.

13. A method of reading out an analog input signal as a digital count comprising:

applying a ramp voltage to a first plate of a capacitor;

applying an analog input signal to an opposed second plate of the capacitor to result in an integrated voltage;

converting, via a source-follower circuit, the integrated voltage to a modified integrated voltage having higher voltage;

inputting the modified integrated voltage to a digital inverter to generate a digital count each time the integrated voltage crosses a threshold in at least one slope direction; and accumulating a plurality of the digital counts over time.

14. The method of claim 13 wherein the ramp voltage is asynchronous.

15. The method of claim 13 wherein inputting the modified integrated voltage to a digital inverter to generate a digital count further comprises feeding back an output signal from the digital inverter, from which the digital count derives, to an input of the digital inverter.

16. The method of claim 13 further comprising:

buffering the output of the digital inverter prior to accumulating the digital count output from the inverter in the plurality of digital counts.

* * * * *